United States Patent
Dunne et al.

(10) Patent No.: US 8,436,475 B2
(45) Date of Patent: May 7, 2013

(54) IC DEVICE HAVING LOW RESISTANCE TSV COMPRISING GROUND CONNECTION

(75) Inventors: Rajiv Dunne, Murphy, TX (US); Gary P. Morrison, Garland, TX (US); Satyendra S. Chauhan, Sugarland, TX (US); Masood Murtuza, Sugarland, TX (US); Thomas D. Bonifield, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/444,508

(22) Filed: Apr. 11, 2012

(65) Prior Publication Data

US 2012/0193814 A1    Aug. 2, 2012

Related U.S. Application Data

(63) Continuation of application No. 12/463,086, filed on May 8, 2009, now Pat. No. 8,178,976.

(60) Provisional application No. 61/052,471, filed on May 12, 2008.

(51) Int. Cl.
*H01L 23/48* (2006.01)

(52) U.S. Cl.
USPC ............................ 257/774; 257/E23.174

(58) Field of Classification Search ............ 257/774, 257/676, 778, 737–738, E23.174, E23.037, 257/E23.142, 777
See application file for complete search history.

(56) References Cited

U.S. PATENT DOCUMENTS

2009/0014888 A1* 1/2009 Lee et al. ............. 257/774
2012/0326325 A1* 12/2012 Choi et al. ............ 257/774

* cited by examiner

*Primary Examiner* — Hoa B Trinh
(74) *Attorney, Agent, or Firm* — Steven A. Shaw; W. James Brady; Frederick J. Telecky, Jr.

(57) ABSTRACT

A semiconductor device includes an integrated circuit (IC) die including a substrate, and a plurality of through substrate via (TSV) that extends through the substrate to a protruding integral tip and which is partially covered with a dielectric liner and partially exposed from the dielectric liner. A metal layer is on the bottom surface of the IC die physically connecting the plurality of TSVs and physically and electrically connected to connecting the first metal protruding tips of TSVs.

10 Claims, 2 Drawing Sheets

IC DEVICE HAVING LOW RESISTANCE TSV COMPRISING GROUND CONNECTION

CROSS REFERENCE TO RELATED APPLICATIONS

This application is a continuation of and claims priority to U.S. patent application Ser. No. 12/463,086 filed on May 8, 2009, now U.S. Pat. No. 8,178,976, which claims the benefit of U.S. Provisional Application Ser. No. 61/052,471 entitled "METHODS OF MAKING IMPROVED ELECTRICAL CONNECTION IN IC CHIPS USING THROUGH Si VIAS", filed May 12, 2008, which is herein incorporated by reference in its entirety.

FIELD

Embodiments of the present invention relate to integrated circuit (IC) devices having through substrate vias (TSVs).

BACKGROUND

As known in the art, TSVs which are also referred to as through-wafer vias (TWVs), are vertical electrical connections that pass from the frontside surface of a wafer or IC die (e.g., contact level or one of the metal levels) completely through to the backside surface. As a result, electrical paths through the device can be significantly shortened relative to conventional wire bonding technology, leading to significantly faster device operation and smaller footprints because the interconnect is within the footprint of the IC die and thus does not require any additional area.

Regarding fabrication of TSVs, in a conventional via-first process, vias are formed through the top semiconductor comprising surface of the wafer in the front end of the line (FEOL) portion of the process using chemical etching, laser drilling, or one of several energetic methods, such as Reactive Ion Etching (RIE). The vast array of vias must be accurately located and have an acceptable cross-sectional profile. Once the through-vias are formed, they are framed with a dielectric liner (e.g., thermally grown silicon oxide) and are then filled with an electrically conductive filler material. Copper plating, preceded by barrier layer and seed layer deposition, represents a conventional TSV filling method, although through-vias can also be filled using other methods and with other electrically conductive filler materials (e.g., W, or highly doped polysilicon).

As known in the art, low resistance electrical ground connections in IC's, particularly for certain RF devices, are required for proper device function. In the case of TSV technology, one or more of the TSVs can be used for ground connections to the front side of the IC through coupling to a grounded electrical conductor that is beneath the bottom surface of the IC.

In one known arrangement, an anisotropic conducting film (ACF) is used between the TSV tip(s) and a package substrate (e.g., die pad) to reduce the resistance (and inductance) between the TSV tip(s) and the package substrate as compared to a bond wire connection. The TSV tips penetrate into the ACF. The ACF includes a plurality of electrically conductive particles electrically isolated from one another by a dielectric base material, such as an epoxy. Although the ACF arrangement reduces the electrical resistance between the TSV tips and the package substrate somewhat, the reduction is limited because the ACF particles are generally 3-5 µm in size (and are thus significantly smaller than the typical distance between the TSV tip(s) and a package substrate) and the particle loading is such that the statistical probability of trapping enough (if any) particles beneath the TSV tip diameter to make a low resistance electrical joint is low. Accordingly, the minimum nominal resistance between the TSV tips and the package substrate (e.g., die pad) provided by the ACF arrangement is still generally too high for proper performance of certain analog ICs, in particular for certain RF ICs, such as power amplifiers.

SUMMARY

The Present Inventors have recognized that using the ACF arrangement described above generally does not reduce the minimum nominal electrical resistance between the TSV tips and the die pad or other package substrate sufficiently for a low resistance ground for proper performance of certain ICs, such as RF ICs (e.g., power amplifiers). The use of a metal layer on both the bottom surface of the IC die and on the protruding TSV tips has been found by the Present Inventors to significantly reduce the electrical resistance between the TSV tip(s) and the package substrate (e.g., die pad). As used herein, a protruding integral TSV tip comprises an electrically conductive filler material and optional liner that both protrude from the bottom surface of the substrate.

By combining a metal layer on the bottom surface of the IC and the protruding integral TSV tips along with ground connection enhancement region comprising interconnect mediums described herein, the electrical resistance can be further reduced. The minimum nominal resistance between the protruding integral TSV tips and a package substrate (e.g., die pad) provided by the embodiments of the invention is estimated as being at least an order of magnitude up to several orders of magnitude lower as compared to the ACF arrangement described in the background above, making embodiments of the invention particularly well suited for improving the performance of analog ICs, such as for RF ICs including power amplifiers.

Embodiments of the present invention describe IC die comprising a substrate having a semiconductor surface (and wafers having a plurality of such IC die) having at least one, and generally a plurality of TSVs. The TSVs comprise a first electrically conductive composition and include a protruding integral tip having sidewalls comprising the first electrically conductive composition that protrudes from a bottom surface of the substrate to a tip having a distal end that has a tip height that is generally between 1 and 50 µm. A metal layer is on the bottom surface of the IC die, and the sidewalls and the distal end of the protruding integral tip, wherein the metal layer comprises a second electrically conductive metal comprising composition that is different from the first electrically conductive composition.

The low resistance joint/interconnection ground connections formed between the TSV(s) and package substrates are described herein using a combination of different materials/integration approaches. Other embodiments of the invention describe semiconductor devices comprising such IC die bonded to a package substrate, and methods to form the same.

As used herein, a "metal" refers to any material, whether single component or a composite, that provides a 25° C. specific resistivity (SR) of <10 mohms-cm. Most elements regarded as being metals provide 25° C. SRs of <100 µohms-cm, such as silver (Ag) 1.6 µohms-cm and gold (Au) an SR of 2.35 µohms-cm. Moreover, as used herein, a TSV is defined to include any through the die via connection, independent of the substrate type. Accordingly, the substrate need not comprise silicon, or can comprise only a thin surface layer of a silicon comprising material (e.g., SOI technologies).

The package substrate can comprise a printed circuit board (PCB), BT substrate, lead frame, or tape. The lead frame can be part of generally any wire-bond (WB) package type, such as QFN or QFP, for example.

DETAILED DESCRIPTION

Figure 1A:
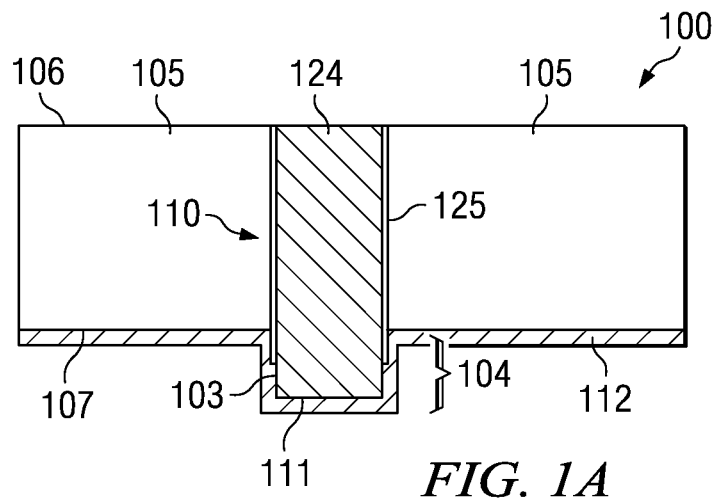
FIG. 1A is a cross sectional depiction of an IC die comprising a substrate including a top semiconductor comprising surface and a bottom surface and at least one TSV having a protruding integral tip, and a metal layer on both the bottom surface of the IC die and the distal end of the protruding integral tip, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Referring to FIG. 1A, a cross sectional depiction of an IC die 100 is shown comprising a substrate 105 including a top semiconductor comprising surface 106 and a bottom surface 107 on an opposite side of the IC die 100. Although described as an IC die 100, the substrate 105 can comprise a wafer having a plurality of IC die 100. The TSV 110 comprises a first electrically conductive filler material 124 (e.g., Cu or a Cu alloy) having an optional liner 125. TSV 110 includes a protruding integral tip 104 comprising sidewalls 103 that comprises the first electrically conductive filler material 124. The height of the protruding integral tip 104 is generally referred to herein as the "tip height".

Liner 125 is shown extending from the top semiconductor surface 106 to the bottom surface 107 and include a tip liner portion that extends past the bottom surface 107 a distance equal to at least 1% of tip height. Liner 125 provides the function of ensuring a non-reentrant profile where TSV 110 interfaces with bottom surface 107.

Liner 125 can also help prevent the first electrically conductive filler material 124 from oxidizing, such as when first electrically conductive filler material 124 comprises a readily oxidizable metal, such as Cu. Liner 125 can comprise a dielectric (an oxide or nitride), semiconductor or electrical conductor (e.g., metal). FIG. 1A shows the liner 125 extending out from the bottom surface 107 of substrate 105 a distance that is at least about 50% of the tip height.

To form the liner 125 including a tip liner portion, wafers with pre-filled embedded TSVs can be first background to or close to the tip of the embedded TSV, and followed by a sequence of dry or wet etches with differing selectivities to the substrate (e.g., Si) the material comprising the liner 125 (e.g., oxide). For example, an exemplary process sequence is described below for forming die having dielectric lined TSVs having integral TSV tips and a dielectric tip liner that protrudes from the bottom side of the die. Other processes sequences may also be used with embodiments of the invention.

Embedded via-first TSVs are conventionally formed by topside via etching (e.g., by RIE) to a depth less than the thickness of the substrate/wafer, framing the via by forming a dielectric liner in the via, followed by filling the via with an electrically conductive filler material. A barrier metal layer (e.g., Ta or TaN) is also generally included and in some embodiments a seed layer (e.g., for copper) is generally also included. The wafer is then generally background to expose the tip of the embedded TSV.

The process described is an exemplary multi-step chemical etch process which is exclusive of mechanical etching that processes wafers having embedded via-first TSVs to form protruding integral TSV tips that avoids contact of the TSV tips with the grinding tool. The multi-step chemical etch process described herein completes the substrate thinning process began by backgrinding and then typically chemical mechanical polishing (CMP), by gently (i.e. non-mechanically) removing a protective substrate layer that is between the bottom of the embedded via-first TSV tip and the bottom side of the substrate that remains following the mechanical removing process(es) to form protruding integral TSV tips.

Avoiding direct physical contact of the TSV tip with the background tool has been found by the Present Inventors to avoid, or at least significantly reduce, mechanical damage to the electrically conductive filler material, diffusion barrier metal (if present) and dielectric liner surrounding the TSV, as well as reduce or eliminate smearing of the electrically conductive filler material (e.g., metal) on the bottom substrate surface. As defined herein, a "chemical etch" refers to a wet or dry (e.g., plasma) etch that is exclusive of mechanical etching. A "chemical etch exclusive of mechanical etching" as used herein can include CMP provided the CMP process is configured to function as a chemical etch by providing a selectivity between the material of the wafer (e.g., silicon) and the dielectric liner of >10:1, and thus have at most a minimal mechanical component. For example, a CMP process having no abrasive particles (e.g. no particles having a Mohs hardness≧the Mohs hardness of silica) can in certain arrangements provide a minimal mechanical component.

A first backside etch can be used to etch the bottom surface of the wafer with selectivity with respect to the liner to form an protruding integral TSV tip having an initial tip height $H_{initial}$. The etch selectivity for the first backside etch is generally high enough to avoid removing the dielectric liner to expose the electrically conductive filler material of the protruding integral TSV tip. The first backside etch generally has a selectivity between the material of the wafer (e.g., silicon) and the dielectric liner 111 of >10:1, and is typically 100:1 to 1,000:1 or more. A selectivity lower than about 10 will generally cause excessive loss of the dielectric liner.

The first backside etch process can comprise a variety of wet etch options including quaternary ammonium hydroxides such as ((CH$_3$)$_4$NOH); tetramethyl ammonium hydroxide) commonly referred to as TMAH, KOH, choline, mixtures of acids such as HF, nitric, sulphuric, and phosphoric. Alternatively, a dry etch process, such as a fluorine containing plasma etch, can also generally be used. As another alternative, CMP can be used if it is configured to provide provided a selectivity between the material of the wafer 105 (e.g., silicon) and the dielectric liner 111 of >10:1.

The range of the thickness of the wafer that is removed by the first backside etch is generally <6% within a wafer with average variation of <5% from wafer to wafer. The total substrate amount etched in the first backside etch is generally from 5 to 50 μm.

A second backside etch is for removing the dielectric liner from at least the distal end of the protruding integral TSV tip. This process can comprise a wet etch process such as HF or dilute HF, or a fluorine-based plasma etch. The dielectric liner may become recessed from the bottom surface of substrate to form a dielectric liner recess on the periphery of the protruding integral TSV tip because the dielectric liner is generally removed at a significantly higher etch rate as compared to the etch rate of the backside surface of the wafer (e.g., silicon). However, the second backside etch process may be selected to etch the bottom surface of the substrate at a rate relative to that of dielectric liner that is high enough to avoid or at least limit formation of such dielectric recesses.

The second backside etch should generally have a selectivity between etching the dielectric liner and electrically conductive filler material of >2:1, typically being >10:1. Lower selectivity below about 2:1 can cause excessive loss of the electrically conductive filler material.

The range of the thickness of the dielectric liner that is removed by the second backside etch should generally be <10% within a wafer with average variation of <10% from wafer to wafer. The total etch amount for dielectric liner is generally from 0.2 to 10 μm.

The second backside etch can also be a sequence of two or more etch conditions to remove the full thickness of the dielectric liner to expose the surface of the electrically conductive filler material for protruding integral TSV tip. The exposed surface of the electrically conductive filler material should generally be free of significant corrosion (i.e. oxide). As noted above, the second backside etch can also be selected to remove the barrier metal layer if present on the surface of the electrically conductive filler material for protruding integral TSV tip.

A third backside etch is for removing substrate material (e.g., silicon) from the bottom surface of substrate to achieve the desired TSV tip height. As described above, the tip height can generally range from 1 μm to 50 μm, and is typically selected depending on the standoff distance for the particular package design and joint used to bond to the TSVs to a workpiece. The third backside etch process has a selectivity to the electrically conductive filler material and generally also a selectivity to the dielectric liner. The resulting height of the dielectric liner on the integral TSV tip referred to herein as the dielectric tip liner has a height $h_{dielectric}$. $h_{dielectric}$ generally ranges from 0.1 μm to 50 μm and typically ranges from 10 to 90% of the tip height, such as 3 μm to the tip height minus 3 μm. The protruding integral TSV tip can include an exposed tip portion that comprises exposed electrically conductive filler material on the end of protruding integral TSV tip. Exposed tip portion thus extends beyond dielectric tip liner.

Analogous the first backside etch, the third backside etch process generally has a selectivity between the material of the wafer (e.g., silicon) and the dielectric liner of >10:1, and is typically 100:1 to 1,000:1 or more, and can comprise a wet etch with various options including TMAH, KOH, choline, mixtures of acids such as HF, nitric, sulphuric, and phosphoric. Alternatively, a dry etch process, such as a fluorine containing plasma etch, can generally be used. As another alternative, CMP can be used if it is configured to provide a selectivity between the material of the wafer (e.g., silicon) and the dielectric liner of >10:1.

The third backside etch generally provides a selectivity between substrate (e.g., silicon) etching and the electrically conductive filler material of the TSV 110 of >2:1, with a typical selectivity of >10:1. Lower selectivity can cause excessive loss of the electrically conductive filler material.

Referring again to FIG. 1A, a metal comprising layer 112 is shown on both the bottom surface 107 of the IC die 100 and the sidewalls 103 and the distal end 111 of the tip 104 including over the liner 125. Metal layer 112 is shown comprising a continuous (i.e. blanket) metal layer that extends over an entire area of the bottom surface 107 of the IC die 100. The metal layer 112 comprises a second electrically conductive metal comprising composition that is different from the first electrically conductive filler material 124. In one embodiment, the metal layer 112 can comprise a solder or solder alloy. Generally, a barrier layer (not shown), then a seed layer (not shown) are under the metal layer 112.

In the case metal layer 112 comprises solder or solder alloy, using a reflow process, the thickness of the solder or solder alloy can be made to be thicker at a center of the IC die 100 as compared to a periphery of the IC die 100 to provide a dome shape thickness profile. A dome shaped thickness profile is defined herein as a center thickness that is generally at least 10% thicker as compared to its thickness at a periphery of the IC die 100. Pre-reflowing of solder or solder alloy on the IC die prior to attaching to a workpiece (e.g., a leadframe) to form a dome shape can help eliminate or at least substantially reduce void entrapment problems.

Figure 1B:
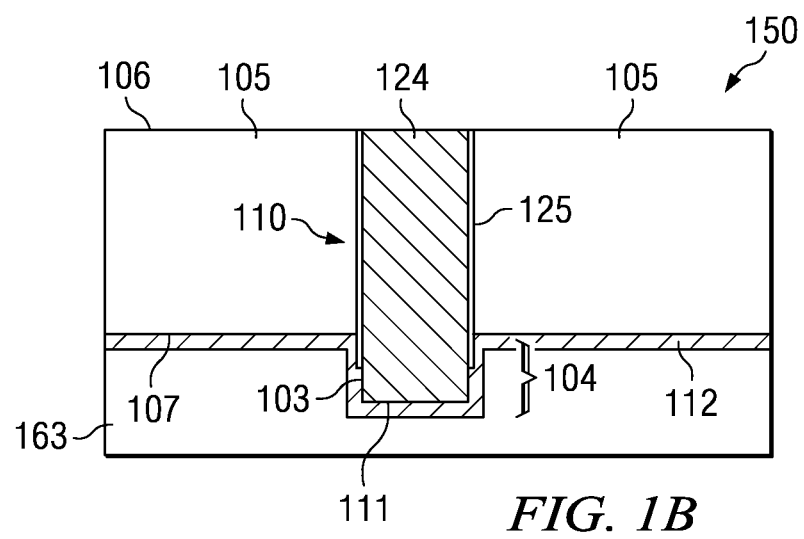
FIG. 1B is a cross sectional depiction of an IC die comprising a substrate including a top semiconductor comprising surface and a bottom surface and at least one TSV having a protruding integral tip, a metal layer on the bottom surface of the IC die, and the sidewalls and the distal end of the protruding integral tip, and an electrically conductive adhesive layer on the metal layer that performs a ground enhancement function, according to an embodiment of the invention.

Now referring to FIG. 1B, an IC die 150 is shown that further comprises an electrically conductive adhesive layer 163 comprising a third electrically conductive composition on the metal layer 112. Electrically conductive adhesive layer 163 performs a ground enhancement function, by lowering the resistance from TSV 110 to a ground connection proximate to the bottom surface 107 of the IC die 150, such as the die pad of a lead frame (not shown). The third electrically conductive composition is compositionally different from the first electrically conductive filler material 124 and the second electrically conductive composition of the metal layer 112.

In one embodiment of the invention, the electrically conductive adhesive layer 163 comprises a metal (e.g., Ag flake) filled polymer, wherein the metal filled polymer provides a room temperature bulk resistivity <500 μohm·cm. In another embodiment, the metal filled polymer can comprise a solder filled polymer, such as a solder filled epoxy. A solder filled polymer (e.g., epoxy) has been found by the Present Inventors to provide a significantly lower resistivity between the TSVs 110 and a package substrate (not shown) as compared to conventional Ag filled epoxy due the formation of a generally interconnected solder network throughout the volume of the die attach adhesive provided the solder composition is selected to provide a melting point melting point that is low enough to melt during the curing step (e.g., SnBi provides a 140° C. melting point which melts during a 175° C. curing step) for the die attach adhesive layer 163. An interconnected solder network can be compared to conventional electrically conductive adhesive layers which comprises a plurality of spaced apart metal particles (Ag) in a dielectric continuous phase. Such low melting point solder comprising compositions avoid the need for relatively high reflow temperatures (e.g., 260° C. for Pb-free solder) that can be detrimental to the IC device.

Upon assembly, the protruding integral tip 104 of the TSV 110 generally extends a distance into the electrically conductive adhesive layer 163. When electrically conductive adhesive layer 163 comprises an electrically connected network as described above, the effective resistance (and thereby inductance) of a joint formed following assembly is thus significantly lower as compared to a conventional TSV which is flush with the bottom surface of the IC die.

Figure 2:
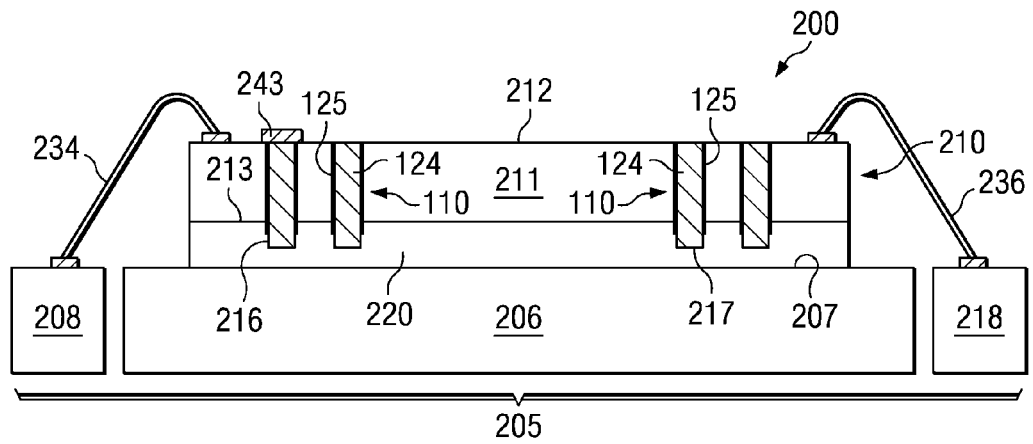
FIG. 2 is a cross sectional depiction of semiconductor device that comprises an IC die comprising at least one TSV having a protruding integral tip and a metal layer on the bottom surface of the IC die mounted face up on the surface of a package substrate, wherein the TSV provides a low resistance ground connection path to the package substrate, according to an embodiment of the invention.

Referring now to FIG. 2, a cross sectional depiction of semiconductor device 200 comprising first IC die 210 comprising of substrate (e.g., wafer or die) 211 including active top semiconductor surface 212 and a bottom surface 213, according to an embodiment of the invention, is shown. Device 200 comprises a package substrate with leadframe 205 comprising a die paddle 206, wherein the die paddle 206 has a top metal comprising surface 207. Packaging material, such as plastic encapsulant, is not shown. Bond wires 234 and 236 are shown providing a connection between an I/O or power supply node for integrated circuitry formed on active semiconductor surface 212 to lead fingers 208 and 218. First IC die 210 is shown mounted face up on the top metal comprising surface 207. A plurality of TSVs 110 comprising a first electrically conductive filler material 124 extends from the top semiconductor comprising surface 212 to protruding integral tips 216 and 217 that extend beyond the bottom surface 213 and provide an electrical contact between die paddle 206 and a ground pad (i.e. connected to ground pins of the IC 210) 243 on the top semiconductor surface 212. Although not shown, TSVs 110 generally include a barrier layer and seed layer in the case of conventional Cu TSVs.

As shown in FIG. 2, the protruding integral tips 216, 217 protrude from the bottom surface 213 of the substrate 211 a tip height that is generally 1 to 50 μm, and is typically between 2 and 20 μm. A metal layer 220 is on both the bottom surface 213 of the substrate 211 and on the protruding integral tips 216, 217. The metal layer 220 comprises a second electrically conductive metal comprising composition that is different from the first electrically conductive filler material 124 of the TSV 110, and the top metal comprising surface 207 of the die paddle 206. The metal layer 220 provides a portion of an electrical connection path between the TSV 110 and the top metal comprising surface 207 of the die paddle 206. The metal layer 220 also shorts together the protruding integral tips 216, 217 of the plurality of TSVs 110.

The metal layer 220 is shown as a continuous metal layer that extends over an entire area of the bottom surface 213 of the substrate 211, with a possible absence on the edge exclusion region when substrate 211 comprises a wafer. However, in other embodiments of the invention (not shown), the metal layer 220 can comprise a discontinuous layer. In one embodiment, the second electrically conductive metal comprising composition of metal layer 220 comprises solder or solder alloy, wherein the solder or solder alloy is bonded directly to the die paddle 206.

In the embodiment where the metal layer 220 comprises solder, such as plating solder or solder alloy, the thickness of the solder comprising layer is generally 3 to 10 μm, with the thickness generally limited to facilitate sawing the wafer. In one embodiment, following deposition of the solder on the entire bottom surface 213 of the substrate 211 (e.g., wafer), the substrate 211 can then be bonded directly to the leadframe 205 (or other package substrate). Solder can be non-reflowed (as-plated) or reflowed (into dome at center) prior to bonding. Reflowing the solder into a dome shape at the center can help eliminate voiding at the die center location. Regarding exemplary assembly options, one option is flux dipping the die w/solder on back-side and place on the strip, followed by mass-reflow. Another option is to screen print flux on each die paddle and then place on the IC die 210 followed by mass reflow.

Figure 3:
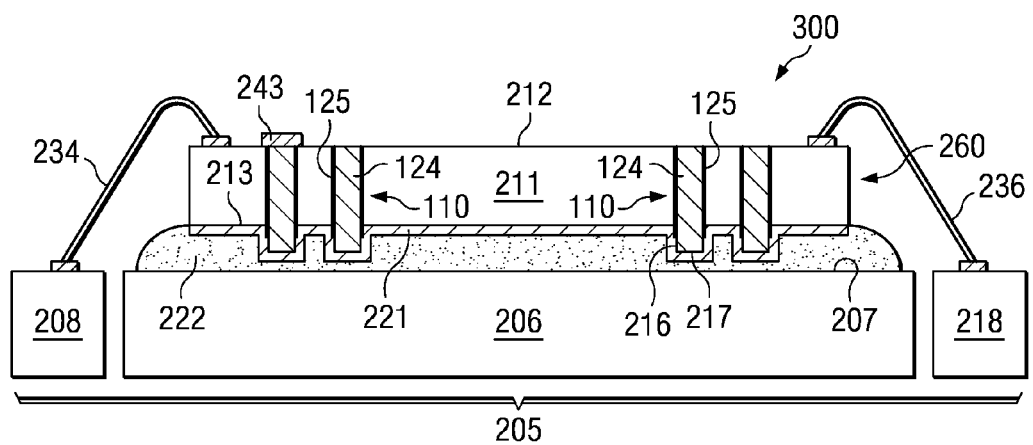
FIG. 3 is a cross sectional depiction of semiconductor device that comprises an IC die comprising TSVs having a protruding integral tip and a metal layer on the bottom surface of the IC die mounted face up joined to a surface of a package substrate, wherein there is an electrically conductive die attach layer that provides a ground connection enhancement region positioned between the metal layer and the package substrate, according to an embodiment of the invention.

FIG. 3 shows a cross sectional depiction of a semiconductor device 300 that comprises IC die 260 joined to die pad 206 of lead-frame 205, according to another embodiment of the invention. The IC die 260 includes a thin metal layer 221 and an electrically conductive die attach adhesive layer 222 comprising a third electrically conductive composition, such as a solder filled polymer, wherein the solder can be arranged in an electrically interconnected network, positioned between the metal layer 221 and the die pad 206 of the package substrate 205. As shown in FIG. 3, the metal layer 221 capped protruding integral tips 216, 217 extend into the electrically conductive die attach adhesive layer 222 which functions as a ground connection enhancement region. Since the TSVs 110 extend a significant distance (e.g., at least 20% of the thickness of the electrically conductive die attach adhesive layer 222) into the electrically conductive die attach adhesive layer 222, the effective electrical resistance (and thereby inductance) of the joint formed can be lower as compared to a conventional arrangement where the TSV is flush with the back side of the die, especially for Ag-filled epoxies.

Thin metal backside finish layer 221 can comprise an electrolessly plated metal finish in a thickness range from about 0.5 to 3 μm. Exemplary materials for thin metal backside finish layer 221 can include Al(Cu), electroless NiPd or NiAu or NiPdAu, Cu/electroless NiPd or NiAu or NiPdAu, and Cu/electrolytic NiPd. Although not shown, protruding integral tips 216, 217 can further comprise tip surface finish layers that are only on the protruding integral tips 216, 217. Exemplary materials for tip finish include electroless NiPd, Electroless NiPdAu, Electroless NiAu, Immersion Ag, Immersion Sn and Electroless Sn. Thin metal backside finish layers 221 and tip surface finish layers can be applied while the substrate 211 (e.g., wafer) is on a wafer carrier.

As described above, in one embodiment, the electrically conductive die attach adhesive layer 222 comprises a metal filled polymer, wherein the metal filled polymer provides a room temperature bulk resistivity at 25° C. of <500 μohm·cm, and generally <100 μohm·cm. Exemplary electrically conductive adhesive materials for ground connection enhancement region/die attach 222 include Ag-filled epoxies and solder-filled polymers such as solder filled epoxies described above. The Ag particles can comprise nanoparticles. Such materials can be dispensed (paste) or wafer-applied (film or paste).

Figure 4:
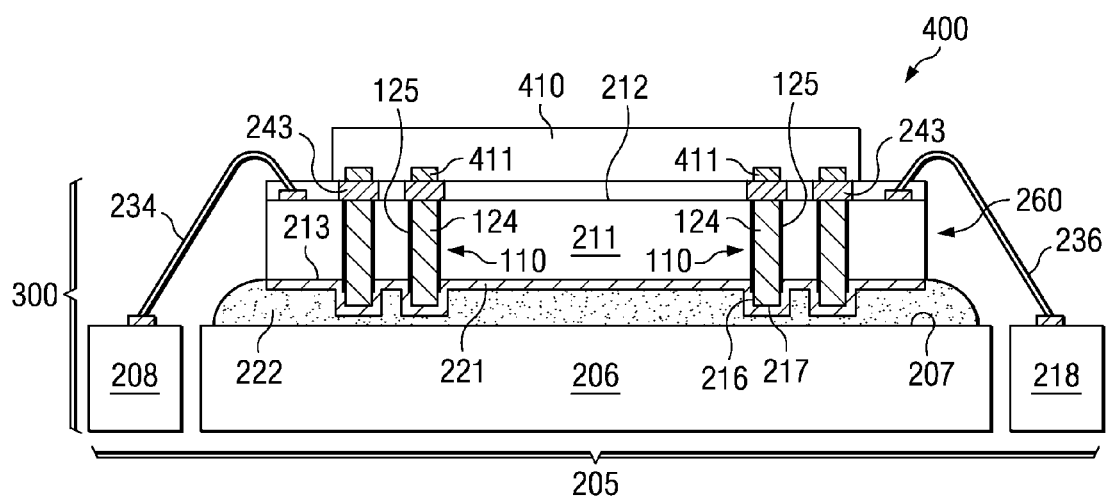
FIG. 4 shows a cross sectional depiction of a stacked die comprising an IC die flip chip joined to the semiconductor device shown in FIG. 3, according to an embodiment of the invention.

FIG. 4 shows a cross sectional depiction of a stacked die comprising semiconductor device 400 according to another embodiment of the invention. Stacked die comprising semiconductor device 400 comprises a second IC die 410 flip chip joined to the semiconductor device 300 shown in FIG. 3. Pads 411 of second IC die 410 are bonded to the tops of TSVs 110 by bond pads 243 which can comprise materials such as solder, Au or other suitable bond pad materials. Low resistance ground connections are thus provided to IC 410 via TSVs 110 to die paddle 206 via protruding integral tips 216, 217, backside finish layer 221 and ground connection enhancement region 222. Although not shown, second IC die 410 can also comprise TSVs and thus be stacked face-up on IC die 260, and can include additional TSV comprising die (not shown) stacked thereon.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. A semiconductor device, comprising:
    an integrated circuit (IC) die, comprising: including a substrate; a plurality of through substrate vias (TSVs); and a metal layer;
    the substrate including a top semiconductor comprising surface and a bottom surface on an opposite side of said IC die;
    the plurality of through substrate vias (TSVs) each comprising a first metal extending from said top semiconductor surface through said substrate to a tip protruding from the bottom surface, and which is partially covered with a dielectric liner and partially exposed from the dielectric liner; and
    the metal layer on said bottom surface of said IC die physically connecting the plurality of TSVs and physically and electrically connected to connecting the first metal protruding tips of TSVs.

2. The semiconductor device of claim 1, wherein the plurality of TSVs are connected to the ground connections in the IC.

3. The semiconductor device of claim 1, wherein the metal layer contacts the dielectric liner covering the protruding tip.

4. The semiconductor device of claim 1, wherein the metal layer extends over an entire area of said bottom surface of said IC die.

5. The semiconductor device of claim 1, further comprising an electrically conductive adhesive layer between the metal layer and a die paddle.

6. The semiconductor device of claim 5, wherein the electrically conductive adhesive layer includes a metal filler.

7. The semiconductor device of claim 1, wherein the protruding tips from 2 and 20 μm.

8. The semiconductor device of claim 1, wherein the dielectric liner extends over the length of the plurality of the TSVs except the exposed portion of the protruding tips.

9. The semiconductor device of claim 1, further comprising bondwires connecting the IC to lead fingers.

10. The semiconductor device of claim 1, further comprising an IC chip attached to surface of the IC die.

* * * * *